(12) United States Patent
Cho et al.

(10) Patent No.: US 9,040,213 B2
(45) Date of Patent: May 26, 2015

(54) POSITIVE PHOTOSENSITIVE RESIN COMPOSITION, PHOTOSENSITIVE RESIN FILM PREPARED BY USING THE SAME, AND SEMICONDUCTOR DEVICE INCLUDING THE PHOTOSENSITIVE RESIN FILM

(75) Inventors: Hyun-Yong Cho, Uiwang-si (KR); Sang-Soo Kim, Uiwang-si (KR); Eun-Kyung Yoon, Uiwang-si (KR); Jong-Hwa Lee, Uiwang-si (KR); Jun-Ho Lee, Uiwang-si (KR); Eun-Ha Hwang, Uiwang-si (KR); Ji-Yun Kwon, Uiwang-si (KR); Jin-Young Lee, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/603,522

(22) Filed: Sep. 5, 2012

(65) Prior Publication Data

US 2013/0164682 A1   Jun. 27, 2013

(30) Foreign Application Priority Data

Dec. 23, 2011   (KR) .................. 10-2011-0141439

(51) Int. Cl.
*G03F 7/023*   (2006.01)

(52) U.S. Cl.
CPC .................... *G03F 7/0233* (2013.01)

(58) Field of Classification Search
CPC .................................................. G03F 7/0233
USPC ................... 430/18, 191, 192, 193
See application file for complete search history.

(56) References Cited

U.S. PATENT DOCUMENTS

| | | | |
|---|---|---|---|
| 2,772,975 A | 12/1956 | Rickers | |
| 2,797,213 A | 6/1957 | Moore | |
| 3,669,658 A | 6/1972 | Yonezawa et al. | |
| 4,339,521 A * | 7/1982 | Ahne et al. | 430/192 |
| 4,395,482 A * | 7/1983 | Ahne et al. | 430/326 |
| 5,114,826 A | 5/1992 | Kwong et al. | |
| 5,376,499 A | 12/1994 | Hammerschmidt et al. | |
| 5,449,584 A | 9/1995 | Banba et al. | |
| 5,486,447 A | 1/1996 | Hammerschmidt et al. | |
| 6,001,517 A | 12/1999 | Kawamonzen | |
| 6,207,356 B1 | 3/2001 | Banba et al. | |
| 6,376,151 B1 | 4/2002 | Takahashi et al. | |
| 7,056,641 B2 | 6/2006 | Naiini et al. | |
| 7,674,566 B2 * | 3/2010 | Shibui | 430/191 |
| 7,687,208 B2 | 3/2010 | Shibui | |
| 8,198,002 B2 | 6/2012 | Jung et al. | |
| 2004/0142275 A1 | 7/2004 | Komatsu | |
| 2004/0229167 A1 | 11/2004 | Naiini et al. | |
| 2009/0035693 A1 * | 2/2009 | Sato et al. | 430/270.1 |
| 2009/0233228 A1 * | 9/2009 | Shibui | 430/281.1 |

FOREIGN PATENT DOCUMENTS

| | | |
|---|---|---|
| CN | 101402796 A1 | 4/2009 |
| CN | 101495919 | 7/2009 |
| CN | 101495919 A1 | 7/2009 |
| CN | 101727006 A1 | 6/2010 |
| JP | 63-096162 A | 4/1988 |
| JP | 05-011451 A | 1/1993 |
| JP | 05-011452 A | 1/1993 |
| JP | 09-302221 A | 11/1997 |
| JP | 10-307393 A | 11/1998 |
| JP | 2000-292913 A | 10/2000 |
| JP | 2011-164289 | 8/2011 |
| KR | 2006-0033919 A | 4/2006 |
| KR | 2008-0049140 A | 6/2008 |
| KR | 2009-0016765 A | 2/2009 |
| KR | 10-2010-0044125 A | 4/2010 |
| KR | 10-2010-0080343 A | 7/2010 |
| KR | 10-0995080 A | 11/2010 |
| KR | 10-2011-0054465 A | 5/2011 |
| TW | 201107372 | 3/2011 |

OTHER PUBLICATIONS

Search Report in counterpart Taiwanese Application No. 101133287 dated May 26, 2014, pp. 1.
English-translation Search Report in counterpart Taiwanese Application No. 101133287 dated May 26, 2014, pp. 1.
Search Report in counterpart Chinese Application No. 201210316718.2 dated Apr. 27, 2014, pp. 1-2.
English translation of Search Report in counterpart Chinese Application No. 201210316718.2 dated Apr. 27, 2014, pp. 1-2.
Feld et al., "Synthesis and Polymerization of a DiaminoDiol Containing a Phosphine-Oxide Linkage," Polymer Preprints 2003, 44(1), p. 898.

* cited by examiner

*Primary Examiner* — John Chu
(74) *Attorney, Agent, or Firm* — Additon, Higgins & Pendleton, P.A.

(57) ABSTRACT

Disclosed is a positive photosensitive resin composition that includes (A) an alkali soluble resin prepared by a phosphorous-containing diamine represented by the following Chemical Formula 1, (B) a photosensitive diazoquinone compound, and (C) a solvent. A photosensitive resin film prepared using the same and a semiconductor device including the photosensitive resin film are also disclosed.

[Chemical Formula 1]

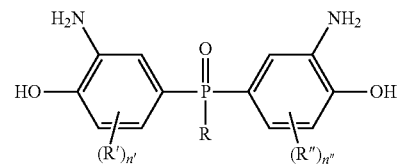

In Chemical Formula 1, each substituent is the same as defined in the detailed description.

10 Claims, No Drawings

POSITIVE PHOTOSENSITIVE RESIN COMPOSITION, PHOTOSENSITIVE RESIN FILM PREPARED BY USING THE SAME, AND SEMICONDUCTOR DEVICE INCLUDING THE PHOTOSENSITIVE RESIN FILM

CROSS-REFERENCE TO RELATED APPLICATIONS

This application claims priority to and the benefit of Korean Patent Application No. 10-2011-0141439 filed in the Korean Intellectual Property Office on Dec. 23, 2011, the entire disclosure of which is incorporated herein by reference.

FIELD

This disclosure relates to a positive photosensitive resin composition, a photosensitive resin film prepared by using the same, and a semiconductor device including the photosensitive resin film.

BACKGROUND

A polyimide resin used as an insulation layer material for a light emitting diode can have excellent heat resistance, stability in a process conducted at a temperature of greater than or equal to about 200° C., and mechanical strength, a low dielectric constant (low-k), and excellent planarization characteristics on a coating surface. Further, a polyimide resin used as an insulation layer material can include a small amount of impurities, which can deteriorate the reliability of a device, and can easily provide a fine pattern. Thus, a polyimide resin as an insulation layer material has drawn lots of attention.

A conventional polyimide resin for forming an insulation layer or a semiconductor protective layer for an organic light emitting diode requires an additional photoresist process and subsequently an etching process using an organic solvent after the patterning. Thus, the manufacturing process can be complex and require additional costs. Further, the device can exhibit resist pattern swelling as well as cause an environmental problem due to the use of an organic solvent.

On the other hand, an organic material remaining in an exposed part may be removed in a dry etching method during formation of a semiconductor circuit protective layer or a pixel crystal layer for an organic light emitting diode (OLED) display. As used herein, the dry etching selectively removes a residue in an exposed pattern part. Accordingly, there has been research directed to a resin material which is less influenced by the etching in a non-exposed part.

In addition, the resin material needs to include more carbon in order to provide excellent etching resistance. However, there can be a problem because the resin material can be exposed at a high temperature of greater than or equal to about 400° C.

SUMMARY

One embodiment provides a positive photosensitive resin composition that can have improved photosensitivity, a high residue removal rate at exposed parts, and excellent etching resistance and heat resistance.

Another embodiment provides a photosensitive resin film prepared by using the positive photosensitive resin composition.

Yet another embodiment provides a semiconductor device including the photosensitive resin film.

One embodiment provides a positive photosensitive resin composition that includes (A) an alkali soluble resin prepared using a phosphorous-containing diamine represented by the following Chemical Formula 1; (B) a photosensitive diazoquinone compound; and (C) a solvent.

[Chemical Formula 1]

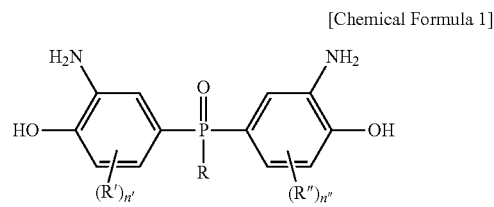

In Chemical Formula 1,

R' and R" are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, or substituted or unsubstituted C6 to C30 aryl, R is substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, or substituted or unsubstituted C6 to C30 aryl, and n' and n" are the same or different and are each independently integers ranging from 0 to 3.

The phosphorous-containing diamine may include a compound represented by the following Chemical Formula 2, Chemical Formula 3 or a combination thereof.

[Chemical Formula 2]

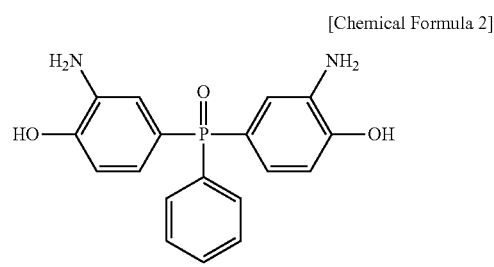

[Chemical Formula 3]

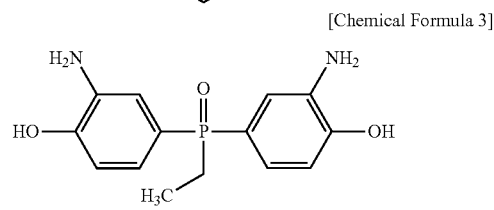

The alkali soluble resin may include a polybenzoxazole precursor including a repeating unit represented by the following Chemical Formula 4.

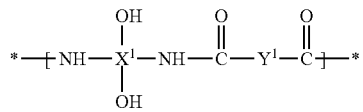

[Chemical Formula 4]

In Chemical Formula 4, $X^1$ is a residual group derived from the phosphorous-containing diamine represented by the above Chemical Formula 1, and $Y^1$ is a substituted or unsubstituted C6 to C30 aromatic organic group, substituted or unsubstituted divalent to hexavalent C1 to C30 aliphatic organic group, or substituted or unsubstituted divalent to hexavalent C3 to C30 alicyclic organic group.

The alkali soluble resin may be prepared from the phosphorous-containing diamine and an aromatic diamine. Examples of the aromatic diamine may include without limitation an aromatic diamine represented by the following Chemical Formula 8, Chemical Formula 9 or a combination thereof.

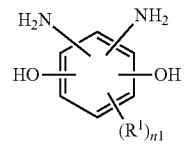

[Chemical Formula 8]

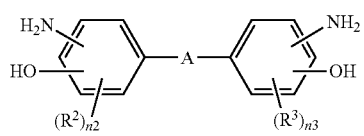

[Chemical Formula 9]

In Chemical Formulae 8 and 9,

A is a single bond, —O—, —CO—, —$CR^4R^5$—, —$SO_2$—, or —S—, wherein $R^4$ and $R^5$ are the same or different and are each independently hydrogen or substituted or unsubstituted C1 to C30 alkyl, $R^1$ to $R^3$ are the same or different and are each independently hydrogen, substituted or unsubstituted C1 to C30 alkyl, a substituted or unsubstituted C1 to C30 carboxyl group, a hydroxy group, or a thiol group, $n_1$ is an integer ranging from 0 to 2, and $n_2$ and $n_3$ are the same or different and are each independently an integer ranging from 0 to 3.

The phosphorous-containing diamine and the aromatic diamine may be mixed at a weight ratio of about 5:95 to about 95:5.

The alkali soluble resin may include a polybenzoxazole precursor including a repeating unit represented by the following Chemical Formula 4 and a repeating unit represented by the following Chemical Formula 10.

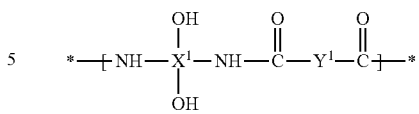

[Chemical Formula 4]

In Chemical Formula 4, $X^1$ is a residual group derived from phosphorous-containing diamine represented by the above Chemical Formula 1, and $Y^1$ is a substituted or unsubstituted C6 to C30 aromatic organic group, substituted or unsubstituted divalent to hexavalent C1 to C30 aliphatic organic group, or substituted or unsubstituted divalent to hexavalent C3 to C30 alicyclic organic group.

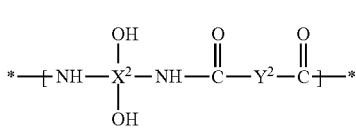

[Chemical Formula 10]

In Chemical Formula 10, $X^2$ is a residual group derived from an aromatic diamine represented by one of the above Chemical Formulae 8 and 9, or a combination thereof, and $Y^2$ is a substituted or unsubstituted C6 to C30 aromatic organic group, substituted or unsubstituted divalent to hexavalent C1 to C30 aliphatic organic group, or substituted or unsubstituted divalent to hexavalent C3 to C30 alicyclic organic group.

The positive photosensitive resin composition may further include (A') an alkali soluble resin prepared from aromatic diamine, wherein the aromatic diamine may include a diamine represented by the above Chemical Formula 8, Chemical Formula 9 or a combination thereof.

The alkali soluble resin prepared from phosphorous-containing diamine (A) and the alkali soluble resin prepared from aromatic diamine (A') may be mixed at a weight ratio of about 5:95 to about 95:5.

The alkali soluble resin may have a weight average molecular weight (Mw) of about 3,000 to about 300,000 g/mol.

The positive photosensitive resin composition may include about 5 to about 100 parts by weight of the photosensitive diazoquinone compound (B) and about 100 to about 900 parts by weight of the solvent (C), based on about 100 parts by weight of the alkali soluble resin (A).

Another embodiment provides a photosensitive resin film prepared using the positive photosensitive resin composition.

Yet another embodiment provides a semiconductor device including the photosensitive resin film.

Other embodiments are described in the detailed description.

The positive photosensitive resin composition can have improved photosensitivity, a high residue removal rate at exposed parts, and excellent etching resistance and heat resistance, and may be used as a protective layer of a semiconductor circuit or a pixel crystal layer of an organic light emitting diode (OLED) display.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" may refer to one substituted with at least a substituent including halogen (—F, —Cl, —Br, or —I), a hydroxy group, a nitro group, a cyano group, an amino group ($NH_2$, $NH(R^{200})$, or $N(R^{201})(R^{202})$, wherein $R^{200}$, $R^{201}$ and $R^{202}$ are the same or different and are each independently C1 to C10 alkyl), an amidino group, a hydrazine group, a hydrazone group, a carboxyl group, substituted or unsubstituted alkyl, substituted or unsubstituted alkenyl, substituted or unsubstituted alkynyl, a substituted or unsubstituted alicyclic organic group, substituted or unsubstituted aryl, substituted or unsubstituted heterocyclic, or a combination thereof in place of at least one of hydrogen of a functional group.

As used herein, when a specific definition is not otherwise provided, the term "alkyl" may refer to C1 to C30 alkyl, for example C1 to C15 alkyl, the term "cycloalkyl" may refer to C3 to C30 cycloalkyl, for example C3 to C18 cycloalkyl, the term "alkoxy" may refer to C1 to C30 alkoxy, for example C1 to C18 alkoxy, the term "aryl" may refer to C6 to C30 aryl, for example C6 to C18 aryl, the term "alkenyl" may refer to C2 to C30 alkenyl, for example C2 to C18 alkenyl, the term "alkylene" may refer to C1 to C30 alkylene, for example C1 to C18 alkylene, and the term "arylene" may refer to C6 to C30 arylene, for example C6 to C16 arylene.

As used herein, when a specific definition is not otherwise provided, the term "aliphatic organic group" may refer to C1 to C30 alkyl, C2 to C30 alkenyl, C2 to C30 alkynyl, C1 to C30 alkylene, C2 to C30 alkenylene, or C2 to C30 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" may refer to C3 to C30 cycloalkyl, C3 to C30 cycloalkenyl, C3 to C30 cycloalkynyl, C3 to C30 cycloalkylene, C3 to C30 cycloalkenylene, or C3 to C30 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, the term "aromatic organic group" may refer to C6 to C30 aryl or C6 to C30 arylene, for example C6 to C16 aryl or C6 to C16 arylene, and the term "heterocyclic group" may refer to C2 to C30 heterocycloalkyl, C2 to C30 heterocycloalkylene, C2 to C30 heterocycloalkenyl, C2 to C30 heterocycloalkenylene, C2 to C30 heterocycloalkynyl, C2 to C30 heterocycloalkynylene, C2 to C30 heteroaryl, or C2 to C30 heteroarylene that include 1 to 3 heteroatoms including O, S, N, P, Si, or a combination thereof, in place of at least one carbon atom of a ring, for example C2 to C15 heterocycloalkyl, C2 to C15 heterocycloalkylene, C2 to C15 heterocycloalkenyl, C2 to C15 heterocycloalkenylene, C2 to C15 heterocycloalkynyl, C2 to C15 heterocycloalkynylene, C2 to C15 heteroaryl, or C2 to C15 heteroarylene that include 1 to 3 heteroatoms including O, S, N, P, Si, or a combination thereof in place of at least one carbon atom in a ring.

As used herein, when a specific definition is not otherwise provided, the term "combination" refers to mixing or copolymerization. Also, the term "copolymerization" refers to block copolymerization or random copolymerization, and the term "copolymer" refers to a block copolymer or a random copolymer.

Also, "*" refers to a linking part between the same or different atoms, or chemical formulae.

The positive photosensitive resin composition according to one embodiment includes (A) an alkali soluble resin, (B) a photosensitive diazoquinone compound, and (C) a solvent.

Hereinafter, each component is described in detail.

(A) Alkali Soluble Resin

The alkali soluble resin may be prepared from a phosphorous-containing diamine represented by the following Chemical Formula 1.

[Chemical Formula 1]

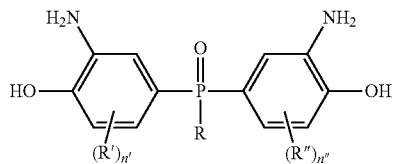

In Chemical Formula 1, R' and R" may be the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, or substituted or unsubstituted C6 to C30 aryl.

In Chemical Formula 1, R is substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, or substituted or unsubstituted C6 to C30 aryl. In exemplary embodiments, R can be substituted or unsubstituted C1 to C20 alkyl or substituted or unsubstituted C6 to C30 aryl.

In Chemical Formula 1, n' and n" are the same or different and are each independently integers of 0 to 3.

An hydroxyl group of the above Chemical Formula 1 is a reactive curable functional group, and an amino group is reacted during polymerization to provide polyhydroxyamide as a polybenzoxazole precursor. In addition, the hydroxy group and the amino group exist at an ortho position relative to each other and may produce a cyclic benzoxazole structure through a ring-closing reaction during a curing process.

When the phosphorous-containing diamine represented by the above Chemical Formula 1 is used to prepare an alkali soluble resin, in particular, a polybenzoxazole precursor, the prepared positive photosensitive resin composition can have excellent photosensitivity, a high residue removal rate at exposed parts during the pattern forming process, and excellent etching resistance and heat resistance.

The phosphorous-containing diamine may include a compound represented by the following Chemical Formula 2, Chemical Formula 3 or a combination thereof.

[Chemical Formula 2]

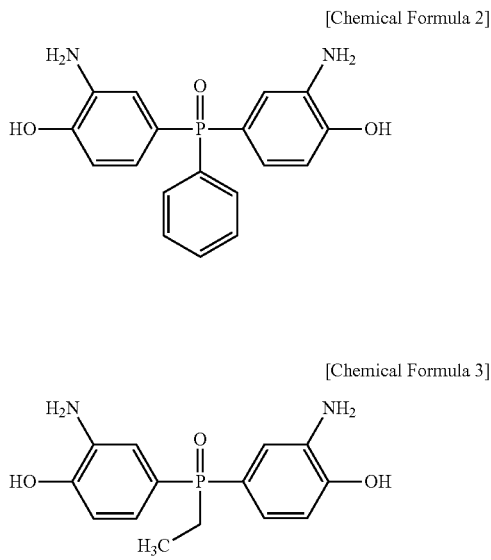

[Chemical Formula 3]

The alkali soluble resin may use a polybenzoxazole precursor including a repeating unit represented by the following Chemical Formula 4 prepared from the phosphorous-containing diamine.

[Chemical Formula 4]

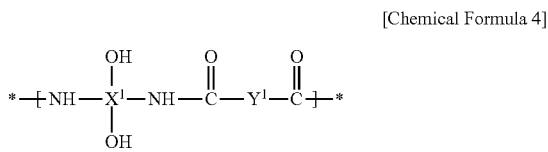

In Chemical Formula 4, $X^1$ is a residual group derived from a phosphorous-containing diamine represented by the above Chemical Formula 1.

In Chemical Formula 4, $Y^1$ is a substituted or unsubstituted C6 to C30 aromatic organic group, substituted or unsubstituted divalent to hexavalent C1 to C30 aliphatic organic group, or substituted or unsubstituted divalent to hexavalent C3 to C30 alicyclic organic group. In one embodiment, $Y^1$ may be a residual group of dicarboxylic acid or a residual group of a dicarboxylic acid derivative.

Examples of the dicarboxylic acid may include without limitation $Y^1(COOH)_2$ (wherein $Y^1$ is the same as $Y^1$ of the above Chemical Formula 6).

Examples of the dicarboxylic acid derivative may include without limitation carbonyl halide derivatives of $Y^1(COOH)_2$ or active compounds of an active ester derivative obtained by reacting $Y^1(COOH)_2$ and 1-hydroxy-1,2,3-benzotriazole.

Examples of the dicarboxylic acid derivative include without limitation 4,4'-oxydibenzoylchloride, diphenyloxydicarbonyldichloride, bis(phenylcarbonylchloride)sulfone, bis(phenylcarbonylchloride)ether, bis(phenylcarbonylchloride)phenone, phthaloyldichloride, terephthaloyldichloride, isophthaloyldichloride, dicarbonyldichloride, diphenyloxydicarboxylatedibenzotriazole, and the like, and combinations thereof.

Examples of $Y^1$ may include functional groups represented by the following Chemical Formulae 5 to 7, and combinations thereof, but is not limited thereto.

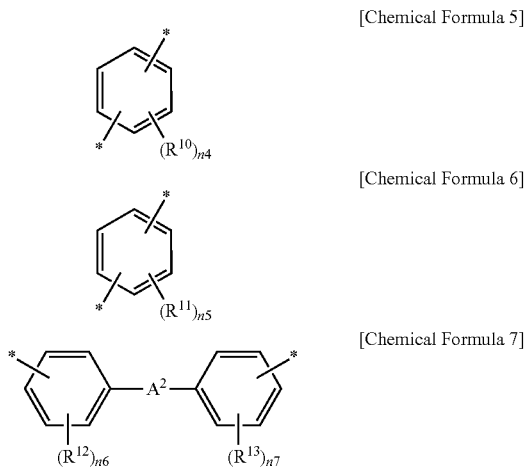

[Chemical Formula 5]

[Chemical Formula 6]

[Chemical Formula 7]

In Chemical Formulae 5 to 7, $R^{10}$ to $R^{13}$ are the same or different and are each independently hydrogen or substituted or unsubstituted C1 to C30 alkyl, $n_4$, $n_6$, and $n_7$ are the same or different and are each independently an integer of 0 to 4, and $n_5$ is an integer of 0 to 3.

In Chemical Formulae 5 to 7, $A^2$ may be a single bond, O, $CR^4R^5$, CO, CONH, S, or $SO_2$, wherein $R^4$ and $R^5$ are the same or different and are each independently hydrogen or substituted or unsubstituted C1 to C30 alkyl, for example C1 to C30 fluoroalkyl.

The alkali soluble resin may be prepared by mixing the phosphorous-containing diamine with aromatic diamine.

Examples of the aromatic diamine may include without limitation a diamine represented by following Chemical Formula 8, Chemical Formula 9, or a combination thereof.

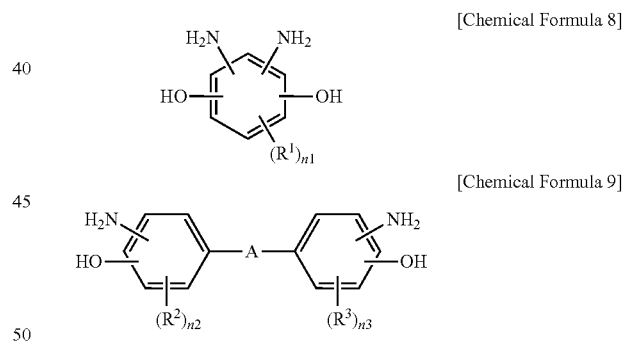

[Chemical Formula 8]

[Chemical Formula 9]

In Chemical Formulae 8 and 9, A is a single bond, —O—, —CO—, —$CR^4R^5$—, —$SO_2$—, or —S—, wherein $R^4$ and $R^5$ are the same or different and are each independently hydrogen or substituted or unsubstituted C1 to C30 alkyl. In one embodiment, A may be —$CR^4R^5$—, wherein $R^4$ and $R^5$ are each C1 to C30 fluoroalkyl.

In Chemical Formulae 8 and 9, $R^1$ to $R^3$ are the same or different and are each independently hydrogen, substituted or unsubstituted C1 to C30 alkyl, a substituted or unsubstituted C1 to C30 carboxyl group, a hydroxy group, or a thiol group.

In Chemical Formulae 8 and 9, $n_1$ may be an integer of 0 to 2, and $n_2$ and $n_3$ are the same or different and are each independently an integer of 0 to 3.

Examples of the aromatic diamine may include without limitation 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2-bis(3-amino-4-hydroxy-5-trifluoromethylphenyl) hexafluoropropane, 2,2-bis(3-amino-4-hydroxy-6-trifluoromethylphenyl)hexafluoropropane, 2,2-bis(3-amino-4-hydroxy-2-trifluoromethylphenyl)hexafluoropropane, 2,2-bis(4-amino-3-hydroxy-5-trifluoromethylphenyl) hexafluoropropane, 2,2-bis(4-amino-3-hydroxy-6-trifluoromethylphenyl)hexafluoropropane, 2,2-bis(4-amino-3-hydroxy-2-trifluoromethylphenyl)hexafluoropropane, 2,2-bis(3-amino-4-hydroxy-5-pentafluoroethylphenyl) hexafluoropropane, 2-(3-amino-4-hydroxy-5-trifluoromethylphenyl)-2-(3-amino-4-hydroxy-5-pentafluoroethylphenyl)hexafluoropropane, 2-(3-amino-4-hydroxy-5-trifluoromethyl phenyl)-2-(3-hydroxy-4-amino-5-trifluoromethylphenyl)hexafluoropropane, 2-(3-amino-4-hydroxy-5-trifluoromethyl phenyl)-2-(3-hydroxy-4-amino-6-trifluoromethylphenyl)hexafluoropropane, 2-(3-amino-4-hydroxy-5-trifluoromethyl phenyl)-2-(3-hydroxy-4-amino-2-trifluoromethylphenyl)hexafluoropropane, 2-(3-amino-4-hydroxy-2-trifluoromethylphenyl)-2-(3-hydroxy-4-amino-5-trifluoromethylphenyl)hexafluoropropane, 2-(3-amino-4-hydroxy-6-trifluoromethyl phenyl)-2-(3-hydroxy-4-amino-5-trifluoromethylphenyl)hexafluoropropane, and the like, and combinations thereof.

The phosphorous-containing diamine and the aromatic diamine may be mixed in a weight ratio of about 5:95 to about 95:5, for example about 5:95 to about 50:50.

In some embodiments, the mixture of the phosphorous-containing diamine and the aromatic diamine may include the phosphorous-containing diamine in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 wt %. Further, according to some embodiments of the present invention, the amount of phosphorous-containing diamine can be in a range from about any of the foregoing amounts to about any other of the foregoing amounts.

In some embodiments, the mixture of the phosphorous-containing diamine and the aromatic diamine may include the aromatic diamine in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 wt %. Further, according to some embodiments of the present invention, the amount of aromatic diamine can be in a range from about any of the foregoing amounts to about any other of the foregoing amounts.

When the phosphorous-containing diamine and the aromatic diamine are mixed in an amount within the above weight ratio range, the prepared positive photosensitive resin composition may have excellent photosensitivity, a high residue removal rate at exposed parts during the pattern forming process, and excellent etching and heat resistances.

The alkali soluble resin may include a polybenzoxazole precursor prepared from the phosphorous-containing diamine and the aromatic diamine.

The polybenzoxazole precursor may include a repeating unit represented by the above Chemical Formula 4 and a repeating unit represented by the above the following Chemical Formula 10.

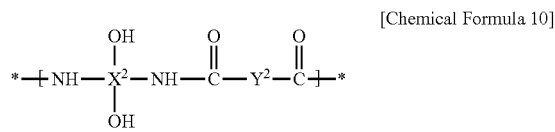

[Chemical Formula 10]

In Chemical Formula 10, $X^2$ is a residual group derived from at least one aromatic diamine represented by the above Chemical Formulae 8 and 9 or a combination thereof. The aromatic diamine is the same as described above.

In Chemical Formula 10, $Y^2$ may be a substituted or unsubstituted C6 to C30 aromatic organic group, substituted or unsubstituted divalent to hexavalent C1 to C30 aliphatic organic group, or substituted or unsubstituted divalent to hexavalent C3 to C30 alicyclic organic group. $Y^2$ is the same as $Y^1$ defined in the above Chemical Formula 4.

The alkali soluble resin prepared from the phosphorous-containing diamine represented by the above Chemical Formula 1 may be mixed with at least one alkali soluble resin prepared from the aromatic diamine represented by the above Chemical Formulae 8 and 9 and combinations thereof. Stated differently, the positive photosensitive resin composition can further include (A') an alkali soluble resin prepared from aromatic diamine, wherein the aromatic diamine comprises a diamine represented by Chemical Formula 8, Chemical Formula 9, or a combination thereof:

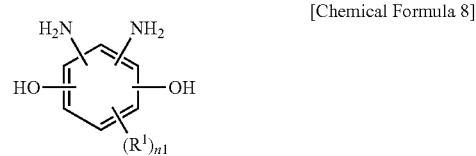

[Chemical Formula 8]

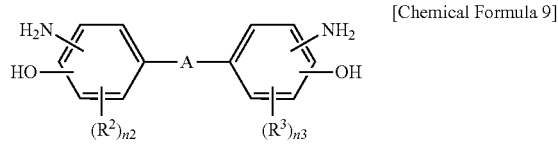

[Chemical Formula 9]

wherein in Chemical Formulae 8 and 9,

A is a single bond, —O—, —CO—, —$CR^4R^5$—, —$SO_2$—, or —S—, wherein $R^4$ and $R^5$ are the same or different and are each independently hydrogen or substituted or unsubstituted C1 to C30 alkyl, $R^1$ to $R^3$ are the same or different and are each independently hydrogen, substituted or unsubstituted C1 to C30 alkyl, a substituted or unsubstituted C1 to C30 carboxyl group, a hydroxy group, or a thiol group, $n_1$ is an integer ranging from 0 to 2, and $n_2$ and $n_3$ are the same or different are and are each independently an integer ranging from 0 to 3.

The alkali soluble resin can include the phosphorous-containing diamine (A) and the alkali soluble resin prepared from aromatic diamine (A') mixed at a weight ratio of about 5:95 to about 95:5.

The alkali soluble resin prepared from the phosphorous-containing diamine and the alkali soluble resin prepared from aromatic diamine may be mixed at a weight ratio of about 5:95 to about 95:5, for example about 5:95 to about 50:50.

In some embodiments, the alkali soluble resin including the phosphorous-containing diamine (A) and the alkali soluble resin prepared from aromatic diamine (A') can include the phosphorous-containing diamine (A) in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 wt %. Further, according to some embodiments of the present invention, the amount of phosphorous-containing diamine can be in a range from about any of the foregoing amounts to about any other of the foregoing amounts.

In some embodiments, the alkali soluble resin including the phosphorous-containing diamine (A) and the alkali soluble resin prepared from aromatic diamine (A') can include the alkali soluble resin prepared from aromatic diamine (A') in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 wt %. Further, according to some embodiments of the present invention, the amount of aromatic diamine can be in a range from about any of the foregoing amounts to about any other of the foregoing amounts.

When the alkali soluble resin includes the phosphorous-containing diamine (A) and the alkali soluble resin prepared from aromatic diamine (A') in amounts within the above weight ratio range, a positive photosensitive resin composition having improved photosensitivity, a high residue removal rate at exposed parts excellent etching resistance and heat resistance during pattern forming processes may be obtained.

The alkali soluble resin may have a weight average molecular weight (Mw) of about 3,000 to about 300,000 g/mol, for example about 5,000 to about 20,000 g/mol. When the alkali soluble resin has a weight average molecular weight within the above range, sufficient film residue ratios at non-exposed parts during development using an alkali aqueous solution may be provided, and patterning may be performed efficiently.

(B) Photosensitive Diazoquinone Compound

The photosensitive diazoquinone compound may be a compound including a 1,2-benzoquinone diazide or 1,2-naphtoquinone diazide structure.

The photosensitive diazoquinone compound may include a compound represented by the following Chemical Formulae 11, 13 to 15, or a combination thereof, but is not limited thereto.

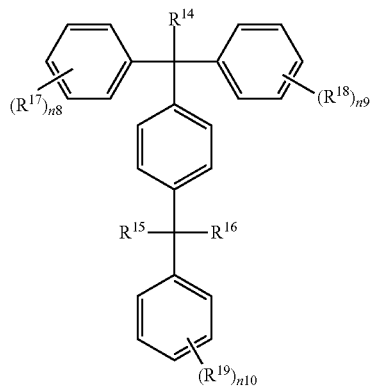

[Chemical Formula 11]

In Chemical Formula 11, $R^{14}$ to $R^{16}$ are the same or different and are each independently hydrogen or a substituted or unsubstituted C1 to C30 alkyl, for example methyl.

In Chemical Formula 11, $R^{17}$ to $R^{19}$ are the same or different and are each independently OQ, wherein Q is hydrogen, a functional group represented by the following Chemical Formula 12a, or a functional group represented by the following Chemical Formula 12b, provided that all Qs are not simultaneously hydrogen.

In Chemical Formula 11, $n_8$ to $n_{10}$ are the same or different and are each independently integers of 0 to 3.

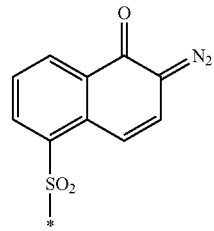

[Chemical Formula 12a]

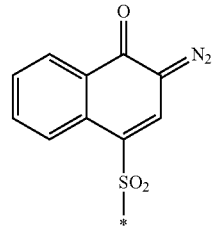

[Chemical Formula 12b]

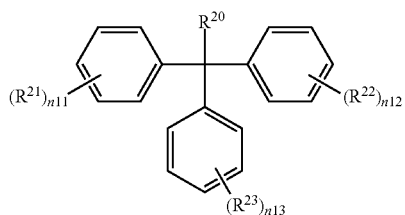

[Chemical Formula 13]

In Chemical Formula 13, $R^{20}$ is hydrogen or substituted or unsubstituted C1 to C30 alkyl, $R^{21}$ to $R^{23}$ are the same or different and are each independently OQ, wherein Q is the same as defined in the above Chemical Formula 11, and $n_{11}$ to $n_{13}$ are the same or different and are each independently integers of 0 to 3.

[Chemical Formula 14]

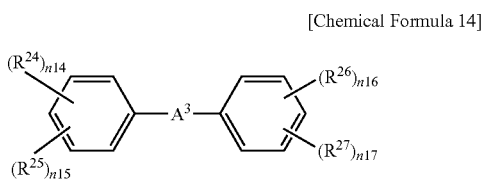

In Chemical Formula 14, $A^3$ is CO or $CR^4R^5$, wherein $R^4$ and $R^5$ are the same or different and are each independently substituted or unsubstituted C1 to C30 alkyl.

In Chemical Formula 14, $R^{24}$ to $R^{27}$ are the same or different and are each independently hydrogen, substituted or unsubstituted C1 to C30 alkyl, OQ, or NHQ, wherein Q is the same as defined in Chemical Formula 11.

In Chemical Formula 14, $n_{14}$ to $n_{17}$ are the same or different and are each independently integers ranging from 0 to 4, and $n_{14}+n_{15}$ and $n_{16}+n_{17}$ are the same or different and are each independently integers of 5 or less, provided that at least one of $R^{24}$ and $R^{25}$ is OQ, and one aromatic ring includes one to three OQs and the other aromatic ring includes one to four OQs.

[Chemical Formula 15]

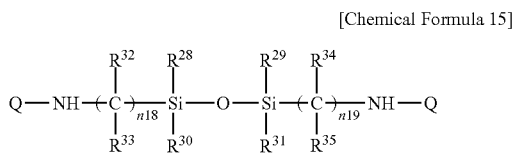

In Chemical Formula 15, $R^{28}$ to $R^{35}$ are the same or different and are each independently hydrogen or substituted or unsubstituted C1 to C30 alkyl, $n_{18}$ and $n_{19}$ are the same or different and are each independently integers ranging from 1 to 5, and each Q is the same as defined in Chemical Formula 11.

The positive photosensitive resin composition may include the photosensitive diazoquinone compound in an amount of about 5 to about 100 parts by weight, for example about 10 to about 50 parts by weight, based on about 100 parts by weight of the alkali soluble resin. In some embodiments, the photosensitive resin composition may include the photosensitive diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of photosensitive diazoquinone compound can be in a range from about any of the foregoing amounts to about any other of the foregoing amounts.

When the amount of the photosensitive diazoquinone compound is within the above range, the pattern can be well-formed with minimal or no residue from exposure, and film thickness loss during development may be minimized or prevented, which can provide a good pattern.

(C) Solvent

The positive photosensitive resin composition may include a solvent that is capable of dissolving each component easily.

Examples of the solvent may include without limitation alkyleneglycol alkyl ethers such as ethyleneglycol monomethylether, ethyleneglycol monoethylether, propyleneglycol monomethylether, propyleneglycol monoethylether, diethyleneglycoldimethylether, diethyleneglycoldiethylether, diethyleneglycoldibutylether, propyleneglycolmonomethylether, dipropyleneglycolmonomethylether, 1,3-butyleneglycol-3-monomethylether, and the like, alkyl acetates such as propyl acetate, butyl acetate, isobutyl acetate, and the like, ketones such as acetylacetone, methylpropylketone, methylbutylketone, methylisobutylketone, cyclopentanone, and the like, alcohols such as butanol, isobutanol, pentenol, 4-methyl-2-pentenol, and the like, aromatic hydrocarbons such as toluene, xylene, and the like, N-methyl-2-pyrrolidone, N-cyclohexyl-2-pyrrolidone, N,N-dimethyl formamide, γ-butyrolactone, N,N-dimethyl acetamide, dimethylsulfoxide, propyleneglycol monomethyletheracetate, methyl lactate, ethyl lactate, butyl lactate, methyl-1,3-butyleneglycolacetate, 3-methyl-3-methoxybutylacetate, methyl pyruvate, ethyl pyruvate, methyl-3-methoxy propionate, and the like, and combinations thereof. The solvent may be used singularly or as a mixture of two or more.

The solvent may be desirably selected according to a method of forming a photosensitive resin film such as spin coating, slit die coating, and the like.

The positive photosensitive resin composition may include the solvent in an amount of about 100 to about 900 parts by weight, for example about 300 to about 800 parts by weight, based on about 100 parts by weight of the alkali soluble resin. When the solvent is used in an amount within the above range, a sufficiently thick film can be obtained, and good solubility and coating can be provided.

In one embodiment, the solvent may be used so that a solid content of the positive photosensitive resin composition is about 5 to about 50 wt %.

(D) Other Additive(s)

The positive photosensitive resin composition according to one embodiment may further include one or more other additives.

The other additives may include a latent thermal acid generator. Examples of the latent thermal acid generator include without limitation arylsulfonic acids such as p-toluenesulfonic acid, benzenesulfonic acid, and the like; perfluoroalkylsulfonic acids such as trifluoromethanesulfonic acid, trifluorobutanesulfonic acid, and the like; alkylsulfonic acids such as methanesulfonic acid, ethanesulfonic acid, butanesulfonic acid, and the like; and the like; and combinations thereof.

The latent thermal acid generator is a catalyst for a dehydration reaction and a cyclization reaction of the polybenzoxazole precursor that is polyamide including a phenolic hxdroxy group, and thus a cyclization reaction may be performed smoothly even if curing temperature is decreased.

In addition, the positive photosensitive resin composition may further include an additive such as a suitable surfactant and/or leveling agent to prevent staining of the film and/or to improve development.

Exemplary processes for forming a pattern using a positive photosensitive resin composition include: coating a positive photosensitive resin composition on a supporting substrate using spin coating, slit coating, inkjet printing, and the like; drying the coated positive photosensitive resin composition to provide a positive photosensitive resin composition layer; exposing the positive photosensitive resin composition layer; developing the positive photosensitive resin composition layer using an alkali aqueous solution to provide a photosensitive resin film; and baking the photosensitive resin film. The conditions of processes to provide a pattern are widely known in this art, so detailed descriptions thereof will be omitted in this specification.

According to another embodiment, a photosensitive resin film prepared using the positive photosensitive resin composition is provided. The photosensitive resin film may be an insulation layer, a buffer layer, or a protective layer.

According to yet another embodiment, a semiconductor device including the photosensitive resin layer is provided. The semiconductor device may be an organic light emitting diode (OLED) or a liquid crystal display (LCD).

The following examples illustrate the present invention in more detail. However, it is understood that the present invention is not limited by these examples.

PREPARATION OF POLYBENZOXAZOLE PRECURSOR

Preparation Example 1

11.0 g of bis(3-amino-4-hydroxyphenyl)(phenyl)phosphine oxide is added to 280 g of N-methyl-2-pyrrolidone (NMP) and dissolved therein in a four-neck flask mounted with an agitator, a temperature controller, a nitrogen gas injector, and a cooler while nitrogen is passed therethrough. When the reactant is completely dissolved, 9.9 g of pyridine is added to the solution. Then, a solution prepared by adding 13.3 g of 4,4'-oxydibenzoylchloride to 142 g of N-methyl-2-pyrrolidone (NMP) is slowly added to the mixture in a dropwise fashion for 30 minutes while the mixture is maintained at a temperature ranging from 0 to 5° C. The resulting mixture is reacted for 1 hour at a temperature ranging from 0 to 5° C. Then, after the temperature of the reactant is increased to room temperature, and the reactant is agitated for 1 hour. Herein, 1.6 g of 5-norbornene-2,3-dicarboxyl anhydride is added to the agitated reactant, and the mixture is agitated at 70° C. for 24 hours. The reaction mixture is precipitated in water/methanol=10/1 (a volume ratio). The precipitate is filtered, sufficiently cleaned with water, and dried at 80° C. under vacuum for greater than or equal to 24 hours, obtaining a polybenzoxazole precursor having a weight average molecular weight of 8,100 g/mol.

Preparation Example 2

The polybenzoxazole precursor is prepared according to the same method as Preparation Example 1 except for using 0.6 g of bis(3-amino-4-hydroxyphenyl)(phenyl)phosphine oxide and 19.6 g of 2,2-bis(3-amino-4-hydroxyphenyl)-1,1,1,3,3,3-hexafluoropropane instead of 11.0 g of bis(3-amino-4-hydroxyphenyl)(phenyl)phosphine oxide. Herein, the polybenzoxazole precursor has a weight average molecular weight of 9,500 g/mol.

Preparation Example 3

The polybenzoxazole precursor is prepared according to the same method as Preparation Example 1 except for using 2.8 g of bis(3-amino-4-hydroxyphenyl)(phenyl)phosphine oxide and 15.5 g of 2,2-bis(3-amino-4-hydroxyphenyl)-1,1,1,3,3,3-hexafluoropropane instead of 11.0 g of bis(3-amino-4-hydroxyphenyl)(phenyl)phosphine oxide. Herein, the polybenzoxazole precursor has a weight average molecular weight of 9,400 g/mol.

Preparation Example 4

The polybenzoxazole precursor is prepared according to the same method as Preparation Example 1 except for using 5.5 g of bis(3-amino-4-hydroxyphenyl)(phenyl)phosphine oxide and 10.3 g of 2,2-bis(3-amino-4-hydroxyphenyl)-1,1,1,3,3,3-hexafluoropropane instead of 11.0 g of bis(3-amino-4-hydroxyphenyl)(phenyl)phosphine oxide. Herein, the polybenzoxazole precursor has a weight average molecular weight of 9,500 g/mol.

Preparation Example 5

The polybenzoxazole precursor is prepared according to the same method as Preparation Example 1 except for using 8.3 g of bis(3-amino-4-hydroxyphenyl)(phenyl)phosphine oxide and 5.2 g of 2,2-bis(3-amino-4-hydroxyphenyl)-1,1,1,3,3,3-hexafluoropropane instead of 11.0 g of bis(3-amino-4-hydroxyphenyl)(phenyl)phosphine oxide. Herein, the polybenzoxazole precursor has a weight average molecular weight of 8,700 g/mol.

Preparation Example 6

The polybenzoxazole precursor is prepared according to the same method as Preparation Example 1 except for using 8.3 g of bis(3-amino-4-hydroxyphenyl)(phenyl)phosphine oxide and 5.2 g of 2,2-bis(3-amino-4-hydroxyphenyl)-1,1,1,3,3,3-hexafluoropropane instead of 11.0 g of bis(3-amino-4-hydroxyphenyl)(phenyl)phosphine oxide. Herein, the polybenzoxazole precursor has a weight average molecular weight of 8,600 g/mol.

Preparation Example 7

9.5 g of bis(3-amino-4-hydroxyphenyl)(ethyl)phosphine oxide is added to 280 g of N-methyl-2-pyrrolidone (NMP) and dissolved therein in a four-neck flask mounted with an agitator, a temperature controller, a nitrogen gas injector, and a cooler while nitrogen is passed therethrough. When the dissolution is complete, 9.9 g of pyridine is added to the solution. While the temperature of the mixture is maintained at a temperature ranging from 0 to 5° C., a solution prepared by adding 13.3 g of 4,4'-oxydibenzoyl chloride to 142 g of N-methyl-2-pyrrolidone (NMP) is slowly added thereto in a dropwise fashion for 30 minutes. The mixture is reacted for 1 hour at a temperature ranging from 0 to 5° C., and after its temperature is increased up to room temperature, the reactant is agitated for 1 hour. Then, 1.6 g of 5-norbornene-2,3-dicarboxyl anhydride is added to the agitated reactant. The mixture is agitated at 70° C. for 24 hours. The reaction mixture is precipitated in water/methanol=10/1 (a volume ratio). The precipitate is filtered, sufficiently cleaned with water, and dried at 80° C. under vacuum for greater than or equal to 24 hours, obtaining a polybenzoxazole precursor having a weight average molecular weight of 8,000 g/mol.

Preparation Example 8

A polybenzoxazole precursor is prepared according to the same method as Preparation Example 7 except for using 0.5 g of bis(3-amino-4-hydroxyphenyl)(ethyl)phosphine oxide and 19.6 g of 2,2-bis(3-amino-4-hydroxyphenyl)-1,1,1,3,3,3-hexafluoropropane instead of 9.5 g of bis(3-amino-4-hydroxyphenyl)(ethyl)phosphine oxide. Herein, the polybenzoxazole precursor has a weight average molecular weight of 9,400 g/mol.

Preparation Example 9

A polybenzoxazole precursor is prepared according to the same method as Preparation Example 7 except for using 2.4 g of bis(3-amino-4-hydroxyphenyl)(ethyl)phosphine oxide and 15.5 g of 2,2-bis(3-amino-4-hydroxyphenyl)-1,1,1,3,3,3-hexafluoropropane instead of 9.5 g of bis(3-amino-4-hydroxyphenyl)(ethyl)phosphine oxide. Herein, the polybenzoxazole precursor has a weight average molecular weight of 9,300 g/mol.

Preparation Example 10

A polybenzoxazole precursor is prepared according to the same method as Preparation Example 7 except for using 4.8 g of bis(3-amino-4-hydroxyphenyl)(ethyl)phosphine oxide and 10.3 g of 2,2-bis(3-amino-4-hydroxyphenyl)-1,1,1,3,3,3-hexafluoropropane instead of 9.5 g of bis(3-amino-4-hydroxyphenyl)(ethyl)phosphine oxide. Herein, the polybenzoxazole precursor has a weight average molecular weight of 8,900 g/mol.

Preparation Example 11

A polybenzoxazole precursor is prepared according to the same method as Preparation Example 7 except for using 7.1 g of bis(3-amino-4-hydroxyphenyl)(ethyl)phosphine oxide and 5.2 g of 2,2-bis(3-amino-4-hydroxyphenyl)-1,1,1,3,3,3-hexafluoropropane instead of 9.5 g of bis(3-amino-4-hydroxyphenyl)(ethyl)phosphine oxide. Herein, the polybenzoxazole precursor has a weight average molecular weight of 8,500 g/mol.

Preparation Example 12

A polybenzoxazole precursor is prepared according to the same method as Preparation Example 7 except for using 9.0 g of bis(3-amino-4-hydroxyphenyl)(ethyl)phosphine oxide and 1.0 g of 2,2-bis(3-amino-4-hydroxyphenyl)-1,1,1,3,3,3-hexafluoropropane instead of 9.5 g of bis(3-amino-4-hydroxyphenyl)(ethyl)phosphine oxide. Herein, the polybenzoxazole precursor has a weight average molecular weight of 8,400 g/mol.

Preparation Example 13

20.6 g of 2,2-bis(3-amino-4-hydroxyphenyl)-1,1,1,3,3,3-hexafluoropropane is added to 280 g of N-methyl-2-pyrrolidone (NMP) and dissolved therein in a four-neck flask mounted with an agitator, a temperature controller, a nitrogen gas injector, and a cooler while passing nitrogen therethrough. When the dissolution is complete, 9.9 g of pyridine is added to the solution. The mixture is maintained at a temperature ranging from 0 to 5° C., a solution prepared by dissolving 13.3 g of 4,4'-oxydibenzoyl chloride to 142 g of N-methyl-2-pyrrolidone (NMP) is slowly added thereto for 30 minutes in a dropwise fashion. The resulting mixture is reacted for 1 hour at a temperature ranging from 0 to 5° C. Then, the reactant is agitated for one hour after increasing its temperature up to room temperature. Then, 1.6 g of 5-norbornene-2,3-dicarboxyl anhydride is added to the agitated reactant, and the mixture is agitated at 70° C. for 24 hours. The reaction mixture is precipitated in water/methanol=10/1 (a volume ratio). The precipitate is filtered, sufficiently cleaned with water, and dried at 80° C. under vacuum for greater than or equal to 24 hours, obtaining a polybenzoxazole precursor having a weight average molecular weight of 10,200 g/mol.

PREPARATION of POSITIVE PHOTOSENSITIVE RESIN COMPOSITION

Example 1

10 g of the polybenzoxazole precursor according to Preparation Example 1 is added to 35.0 g of γ-butyrolactone (GBL) and dissolved therein, and 1 g of photosensitive diazoquinone represented by the following Chemical Formula 16, 0.02 g of trimethoxy[3-(phenylamino)propyl]silane represented by the following Chemical Formula 17, and 0.75 g of a phenol compound represented by the following Chemical Formula 18 are added thereto and dissolved therein. The solution is filtered using a 0.45 μm fluorine resin filter, preparing a positive photosensitive resin composition.

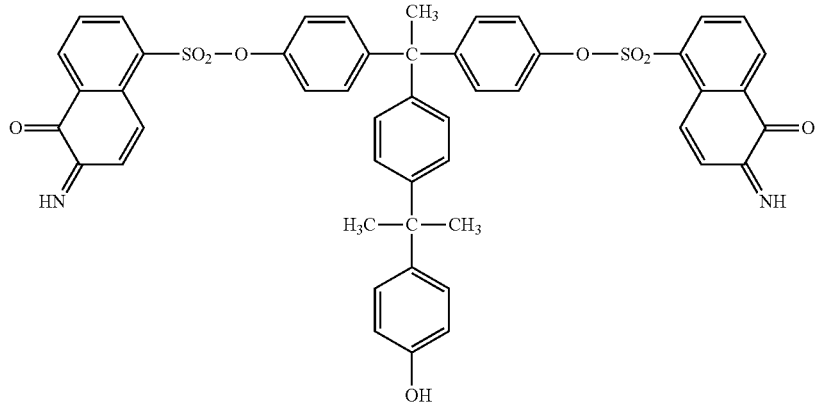

[Chemical Formula 16]

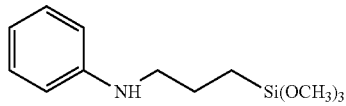

[Chemical Formula 17]

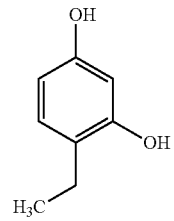

[Chemical Formula 18]

Examples 2 To 12

A positive photosensitive resin composition is prepared according to the same method as Example 1 except for using 10 g of each polybenzoxazole precursor according to Preparation Examples 2 to 12 instead of 10 g of the polybenzoxazole precursor according to Preparation Example 1.

Example 13

A positive photosensitive resin composition is prepared according to the same method as Example 1 except for using 0.5 g of the polybenzoxazole precursor according to Preparation Example 1 and 9.5 g of the polybenzoxazole precursor according to Preparation Example 13 instead of 10 g of the polybenzoxazole precursor according to Preparation Example 1.

Example 14

A positive photosensitive resin composition is prepared according to the same method as Example 1 except for using 5 g of the polybenzoxazole precursor according to Preparation Example 1 and 5 g of the polybenzoxazole precursor according to Preparation Example 13 instead of 10 g of the polybenzoxazole precursor according to Preparation Example 1.

Example 15

A positive photosensitive resin composition is prepared according to the same method as Example 1 except for using 9.5 g of the polybenzoxazole precursor according to Preparation Example 1 and 0.5 g of the polybenzoxazole precursor according to Preparation Example 13 instead of 10 g of the polybenzoxazole precursor according to Preparation Example 1.

Example 16

A positive photosensitive resin composition is prepared according to the same method as Example 1 except for using 0.5 g of the polybenzoxazole precursor according to Preparation Example 7 and 9.5 g of the polybenzoxazole precursor according to Preparation Example 13 instead of 10 g of the polybenzoxazole precursor according to Preparation Example 7.

Example 17

A positive photosensitive resin composition is prepared according to the same method as Example 1 except for using 5 g of the polybenzoxazole precursor according to Preparation Example 7 and 5 g of the polybenzoxazole precursor according to Preparation Example 13 instead of 10 g of the polybenzoxazole precursor according to Preparation Example 7.

Example 18

A positive photosensitive resin composition is prepared according to the same method as Example 1 except for using 9.5 g of the polybenzoxazole precursor according to Preparation Example 7 and 0.5 g of the polybenzoxazole precursor according to Preparation Example 13 instead of 10 g of the polybenzoxazole precursor according to Preparation Example 7.

Comparative Example 1

A positive photosensitive resin composition is prepared according to the same method as Example 1 except for using the polybenzoxazole precursor according to Preparation Example 13 instead of 10 g of the polybenzoxazole precursor according to Preparation Example 1.

Evaluation 1: Thickness Change

Each positive photosensitive resin composition prepared from Examples 1 to 18 and Comparative Example 1 is coated on a 8-inch wafer using a spin coater manufactured by Mikasa (1H-DX2), and then heated on a hot plate to 130° C. for 2 minutes to provide a polybenzoxazole precursor film.

The polybenzoxazole precursor films are exposed through a mask having various sized patterns by an I-line stepper (NSR i10C) manufactured by Japan Nikon, and the exposed part is dissolved and removed in a 2.38% tetramethyl ammonium hydroxide aqueous solution at a room temperature for 40 seconds, 2 puddles, and washed with pure water for 30 seconds. Subsequently, the obtained pattern is cured in an electric furnace under an oxygen concentration of less than or equal to 1000 ppm at 150° C. for 30 minutes and additionally at 320° C. for 30 minutes to provide a patterned film.

Herein, the films are measured for thickness changes after the coating, development, curing, and etching steps using ST4000-DLX equipment (KMAC Corp.), and the results are provided in the following Table 1.

Evaluation 2: Sensitivity

The films are evaluated for sensitivity by measuring the exposure time taken to form a 10 μm L/S pattern having a line width of 1:1 after the exposure and development and using this exposure time as an optimal exposure time. The results are provided in the following Table 1.

Evaluation 3: 5% Weight Decrease Temperature

Dry etching to fabricate the films in Evaluation 1 is performed using a mixed gas of $CHF_3/CF_4$, and the films are measured for 5% weight decrease temperature using a thermal weight analyzer (TGA), while the temperature of the cured thin films is increased by 10° C. per minute under nitrogen. The results are provided in the following Table 1.

TABLE 1

| | Thickness after coating (μm) | Thickness after development (μm) | Thickness after curing (μm) | Thickness after etching (μm) | Sensitivity (mJ/cm$^2$) | 5% weight decrease temperature (° C.) |
|---|---|---|---|---|---|---|
| Example 1 | 10.1 | 9.2 | 8.2 | 7.7 | 410 | 500 |
| Example 2 | 10.0 | 9.1 | 8.1 | 7.4 | 430 | 460 |
| Example 3 | 10.1 | 8.9 | 8.0 | 7.3 | 430 | 460 |
| Example 4 | 10.1 | 9.0 | 8.1 | 7.3 | 430 | 470 |
| Example 5 | 10.0 | 8.9 | 8.0 | 7.4 | 430 | 480 |
| Example 6 | 10.0 | 9.1 | 8.1 | 7.5 | 440 | 490 |
| Example 7 | 10.2 | 8.9 | 8.0 | 7.4 | 400 | 490 |
| Example 8 | 10.1 | 9.0 | 8.1 | 7.5 | 430 | 460 |
| Example 9 | 10.0 | 9.0 | 8.1 | 7.3 | 420 | 460 |
| Example 10 | 10.0 | 8.9 | 7.9 | 7.4 | 430 | 460 |

TABLE 1-continued

| | Thickness after coating (μm) | Thickness after development (μm) | Thickness after curing (μm) | Thickness after etching (μm) | Sensitivity (mJ/cm$^2$) | 5% weight decrease temperature (° C.) |
|---|---|---|---|---|---|---|
| Example 11 | 10.0 | 9.1 | 8.0 | 7.5 | 430 | 470 |
| Example 12 | 9.9 | 8.8 | 7.9 | 7.3 | 440 | 460 |
| Example 13 | 10.1 | 9.1 | 8.0 | 7.3 | 420 | 470 |
| Example 14 | 10.1 | 9.0 | 8.0 | 7.5 | 430 | 480 |
| Example 15 | 10.0 | 9.0 | 8.1 | 7.3 | 410 | 500 |
| Example 16 | 9.9 | 8.7 | 7.8 | 7.0 | 430 | 460 |
| Example 17 | 10.2 | 9.1 | 8.1 | 7.7 | 430 | 460 |
| Example 18 | 10.1 | 9.1 | 8.2 | 7.9 | 400 | 490 |
| Comparative Example 1 | 10.0 | 9.3 | 8.2 | 7.1 | 450 | 450 |

Based on Table 1, the films of Examples 1 to 18 including an alkali soluble resin prepared from a phosphorous-containing diamine according to one embodiment can have excellent photosensitivity, a high residue removal rate in exposed parts, and excellent etching and heat resistances compared with the film including an alkali soluble resin prepared from aromatic diamine according to Comparative Example 1. Accordingly, the films according to Examples 1 to 18 may be usefully applied as a semiconductor circuit protective layer or a pixel crystal layer for an organic light emitting diode (OLED) display.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A positive photosensitive resin composition, comprising (A) an alkali soluble resin prepared using a phosphorous-containing diamine represented by the following Chemical Formula 1 and an aromatic diamine, wherein the phosphorous-containing diamine and the aromatic diamine are mixed at a weight ratio of about 10:90 to about 70:30, wherein the alkali soluble resin comprises a polybenzoxazole precursor including a repeating unit represented by the following Chemical Formula 4 and a repeating unit represented by the following Chemical Formula 10:

[Chemical Formula 4]

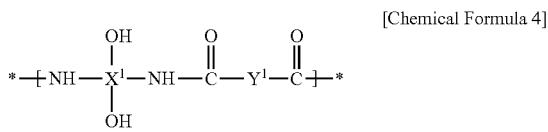

wherein in Chemical Formula 4, $X^1$ is a residual group derived from a phosphorous-containing diamine represented by the following Chemical Formula 1:

[Chemical Formula 1]

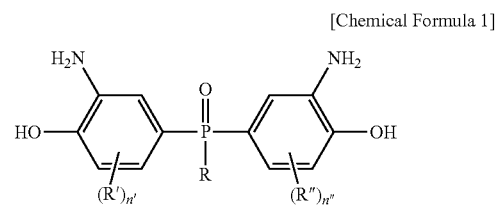

wherein in Chemical Formula 1,

R' and R" are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, or substituted or unsubstituted C6 to C30 aryl, R is substituted or unsubstituted C1 to C20 alkyl, substituted or unsubstituted C2 to C20 alkenyl, substituted or unsubstituted C2 to C20 alkynyl, substituted or unsubstituted C1 to C20 alkoxy, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, or substituted or unsubstituted C6 to C30 aryl, and n' and n" are the same or different and are each independently integers ranging from 0 to 3, and $Y^1$ is a substituted or unsubstituted C6 to C30 aromatic organic group, substituted or unsubstituted divalent to hexavalent C1 to C30 aliphatic organic group, or substituted or unsubstituted divalent to hexavalent C3 to C30 alicyclic organic group:

[Chemical Formula 10]

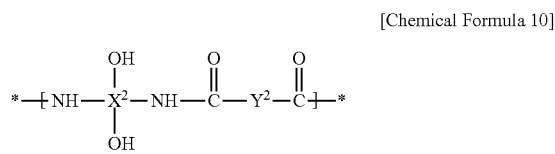

wherein in Chemical Formula 10,

X² is a residual group derived from aromatic diamine represented by the following Chemical Formula 8, Chemical Formula 9, or a combination thereof:

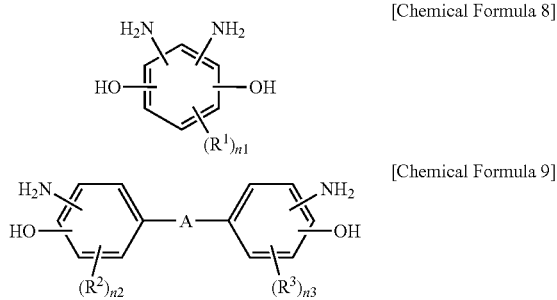

[Chemical Formula 8]

[Chemical Formula 9]

wherein in Chemical Formulae 8 and 9,

A is a single bond, —O—, —CO—, —CR⁴R⁵—, —SO₂—, or —S—, wherein R⁴ and R⁵ are the same or different and are each independently hydrogen or substituted or unsubstituted C1 to C30 alkyl, R¹ to R³ are the same or different and are each independently hydrogen, substituted or unsubstituted C1 to C30 alkyl, a substituted or unsubstituted C1 to C30 carboxyl group, a hydroxy group, or a thiol group, n₁ is an integer ranging from 0 to 2, and N₂ and n₃ are the same or different and are each independently an integer ranging from 0 to 3, and Y² is a substituted or unsubstituted C6 to C30 aromatic organic group, substituted or unsubstituted divalent to hexavalent C1 to C30 aliphatic organic group, or substituted or unsubstituted divalent to hexavalent C3 to C30 alicyclic organic group;

(B) a photosensitive diazoquinone compound; and (C) a solvent.

2. The positive photosensitive resin composition of claim 1, wherein the phosphorous-containing diamine comprises at least one compound represented by the following Chemical Formulae 2 and 3, or a combination thereof:

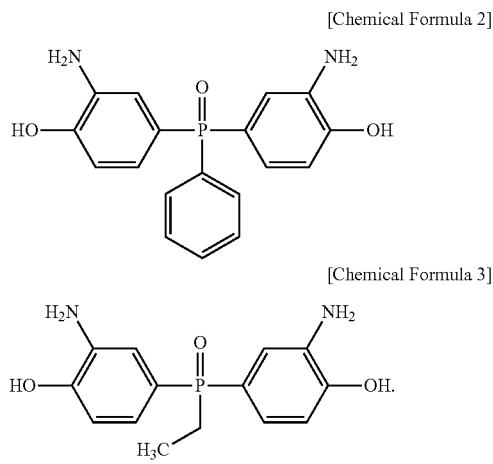

[Chemical Formula 2]

[Chemical Formula 3]

3. The positive photosensitive resin composition of claim 1, wherein the positive photosensitive resin composition further comprises (A') an alkali soluble resin prepared from aromatic diamine, wherein the aromatic diamine comprises a diamine represented by Chemical Formula 8, Chemical Formula 9, or a combination thereof:

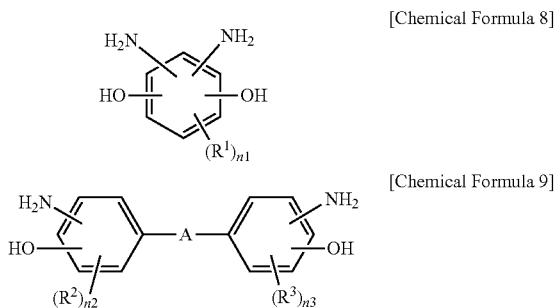

[Chemical Formula 8]

[Chemical Formula 9]

wherein in Chemical Formulae 8 and 9,

A is a single bond, —O—, —CO—, —CR⁴R⁵—, —SO₂—, or —S—, wherein R⁴ and R⁵ are the same or different and are each independently hydrogen or substituted or unsubstituted C1 to C30 alkyl, R¹ to R³ are the same or different and are each independently hydrogen, substituted or unsubstituted C1 to C30 alkyl, a substituted or unsubstituted C1 to C30 carboxyl group, a hydroxy group, or a thiol group, n₁ is an integer ranging from 0 to 2, and n₂ and n₃ are the same or different are and are each independently an integer ranging from 0 to 3.

4. The positive photosensitive resin composition of claim 3, wherein the alkali soluble resin prepared from phosphorous-containing diamine (A) and the alkali soluble resin prepared from aromatic diamine (A') are mixed at a weight ratio of about 5:95 to about 95:5.

5. The positive photosensitive resin composition of claim 1, wherein the alkali soluble resin has a weight average molecular weight (Mw) of about 3,000 to about 300,000 g/mol.

6. The positive photosensitive resin composition of claim 1, wherein the positive photosensitive resin composition comprises:

about 5 to about 100 parts by weight of the photosensitive diazoquinone compound (B) and about 100 to about 900 parts by weight of the solvent (C), based on about 100 parts by weight of the alkali soluble resin (A).

7. A photosensitive resin film prepared using the positive photosensitive resin composition of claim 1.

8. A semiconductor device including the photosensitive resin film according to claim 7.

9. The positive photosensitive resin composition of claim 1, wherein the phosphorous-containing diamine and the aromatic diamine are mixed at a weight ratio of about 10:90 to about 60:40.

10. The positive photosensitive resin composition of claim 1, wherein the phosphorous-containing diamine and the aromatic diamine are mixed at a weight ratio of about 10:90 to about 35:65.

\* \* \* \* \*

UNITED STATES PATENT AND TRADEMARK OFFICE
CERTIFICATE OF CORRECTION

PATENT NO. : 9,040,213 B2
APPLICATION NO. : 13/603522
DATED : May 26, 2015
INVENTOR(S) : Hyun-Yong Cho et al.

It is certified that error appears in the above-identified patent and that said Letters Patent is hereby corrected as shown below:

In the Specification

Column 8, Chemical Formula 6 is depicted as:

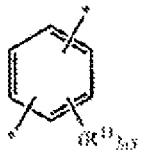

and should be depicted as:

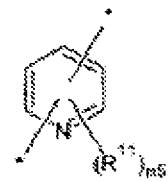

In the Claims

Claim 1, Column 23, Line 30 reads: "$N_2$ and $n_3$ are the same or different and are each indepen-"
and should read: "$n_2$ and $n_3$ are the same or different and are each indepen-"

Signed and Sealed this
Twenty-third Day of August, 2016

Michelle K. Lee
*Director of the United States Patent and Trademark Office*